United States Patent
Xiang

(10) Patent No.: US 10,950,436 B2
(45) Date of Patent: Mar. 16, 2021

(54) ARRAY SUBSTRATE MANUFACTURING USING FLUORINE AND HYDROGENATION PROCESSES

(71) Applicant: Wuhan China Star Optoelectronics Semiconductor Display Technology Co., Ltd., Wuhan (CN)

(72) Inventor: Ming Xiang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/340,137

(22) PCT Filed: Mar. 22, 2019

(86) PCT No.: PCT/CN2019/079192
§ 371 (c)(1),
(2) Date: Apr. 8, 2019

(87) PCT Pub. No.: WO2020/113856
PCT Pub. Date: Jun. 11, 2020

(65) Prior Publication Data
US 2020/0185424 A1    Jun. 11, 2020

(30) Foreign Application Priority Data
Dec. 5, 2018  (CN) .......................... 201811477023.6

(51) Int. Cl.
*H01L 21/02* (2006.01)
*H01L 29/49* (2006.01)
*H01L 29/786* (2006.01)
*H01L 29/66* (2006.01)
*H01L 29/51* (2006.01)
*H01L 29/08* (2006.01)
(Continued)

(52) U.S. Cl.
CPC .... *H01L 21/02664* (2013.01); *H01L 29/0847* (2013.01); *H01L 29/4908* (2013.01); *H01L 29/517* (2013.01); *H01L 29/66969* (2013.01); *H01L 29/7869* (2013.01); *H01L 27/3248* (2013.01); *H01L 27/3276* (2013.01); *H01L 51/56* (2013.01); *H01L 2227/323* (2013.01)

(58) Field of Classification Search
CPC .. H01L 29/7869–78693; H01L 27/3244–3279
See application file for complete search history.

(56) References Cited

U.S. PATENT DOCUMENTS 7,078,312 B1 * 7/2006 Sutanto ................. C23C 16/045
257/E21.252
2006/0267003 A1 * 11/2006 Suh ...................... H01L 51/0002
257/40
(Continued)

*Primary Examiner* — Kevin Parendo

(57) ABSTRACT

A method of fabricating an array substrate, an array substrate, a display panel, and a display device are provided. In an embodiment, a gate insulating layer above a channel region is doped with fluorine atoms. Since a fluorine-containing inorganic layer can absorb hydrogen atoms, it can block hydrogen atoms from diffusing downward into a metal oxide semiconductor, thereby avoiding affecting electrical properties of thin film transistors. Simultaneously, only a metal is required to use as a metal gate layer, which simplifies process and reduces production costs.

14 Claims, 4 Drawing Sheets

(51) Int. Cl.
  *H01L 27/32*   (2006.01)
  *H01L 51/56*   (2006.01)

(56)             References Cited

U.S. PATENT DOCUMENTS

| | | | |
|---|---|---|---|
| 2011/0086467 A1* | 4/2011 | Chou | H01L 51/001 |
| | | | 438/99 |
| 2011/0140116 A1* | 6/2011 | Morosawa | H01L 29/4908 |
| | | | 257/59 |
| 2015/0017753 A1* | 1/2015 | Bae | H01L 51/56 |
| | | | 438/46 |
| 2015/0053970 A1 | 2/2015 | Lee et al. | |
| 2016/0087208 A1* | 3/2016 | Matsushita | C07F 9/145 |
| | | | 524/516 |
| 2017/0141231 A1 | 5/2017 | Matsumoto et al. | |
| 2018/0090617 A1* | 3/2018 | Youn | H01L 29/41733 |
| 2018/0158954 A1* | 6/2018 | Matsumoto | H01L 21/02565 |

\* cited by examiner

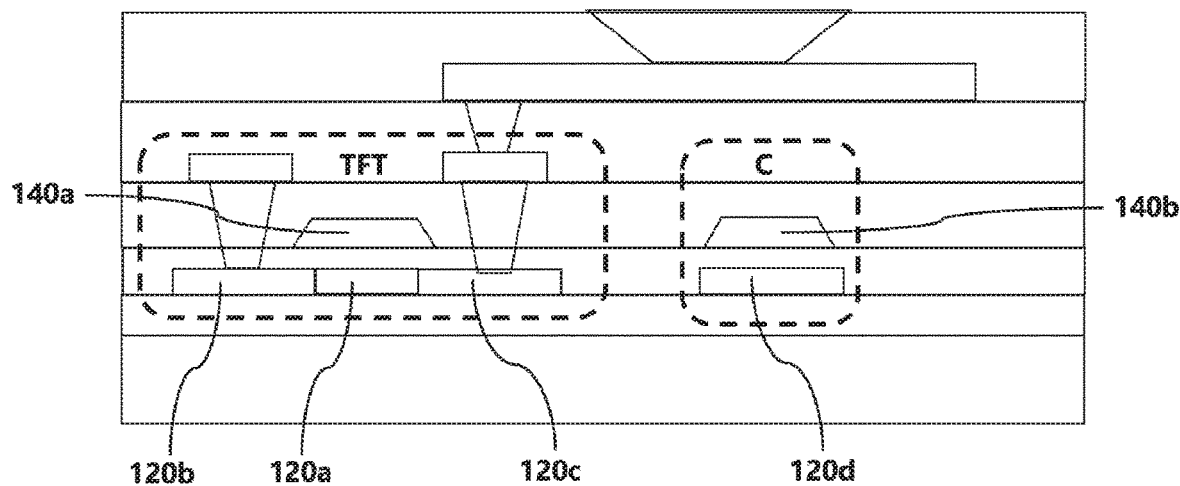

FIG. 1

```
┌─────────────────────────────────────────────┐
│ Depositing to form a buffer layer, a metal  │
│ oxide layer, and a gate insulating layer on │─── 101
│ the substrate in sequence                   │
└─────────────────────────────────────────────┘
                      ▼
┌─────────────────────────────────────────────┐
│ Fluorine-atom-doping the gate insulating    │
│ layer such that the gate insulating layer   │
│ above the channel region comprises fluorine │─── 102
│ atoms, and other regions of the gate        │
│ insulating layer does not comprise the      │
│ fluorine atoms                              │
└─────────────────────────────────────────────┘
                      ▼
┌─────────────────────────────────────────────┐
│ Forming a metal gate layer and an interlayer│
│ dielectric layer on the gate insulating     │─── 103
│ layer in sequence                           │
└─────────────────────────────────────────────┘
                      ▼
┌─────────────────────────────────────────────┐
│ Performing a hydrogenation activation       │
│ process, such that the metal oxide layer of │
│ the channel region maintains semiconductor  │
│ characteristics due to diffusion of hydrogen│
│ atoms being blocked by the fluorine atoms   │─── 104
│ comprised in the gate insulating layer above│
│ the channel region, such that the hydrogen  │
│ atoms pass through other regions, except the│
│ channel region, of the metal oxide layer, so│
│ as to form a conductor                      │
└─────────────────────────────────────────────┘
                      ▼
┌─────────────────────────────────────────────┐
│ Forming a source/drain wiring layer, an     │
│ organic planarization layer, an anode wiring│─── 105
│ layer, and a pixel defining layer on the    │
│ metal oxide layer in sequence               │
└─────────────────────────────────────────────┘
```

FIG. 2

ARRAY SUBSTRATE MANUFACTURING USING FLUORINE AND HYDROGENATION PROCESSES

RELATED APPLICATIONS

This application is a National Phase of PCT Patent Application No. PCT/CN2019/079192 having International filing date of Mar. 22, 2019, which claims the benefit of priority of Chinese Patent Application No. 201811477023.6 filed on Dec. 5, 2018. The contents of the above applications are all incorporated by reference as if fully set forth herein in their entirety.

FIELD AND BACKGROUND OF THE INVENTION

The present disclosure relates to semiconductor technologies, and particularly to a method of fabricating an array substrate, an array substrate, a display panel, and a display device.

Active-matrix organic light-emitting diodes (AMOLEDs) are a display technology. Among them, active matrix bodies (AMs, or referred as active-type matrix body) refer to a behind pixel addressing technology. Organic light-emitting diodes (OLEDs) are a specific type to describe a thin film display technology, which is an organic electroluminescent display. Compared with conventional liquid crystal displays used in most mobile phones, AMOLEDs are now widely used in smartphones with wider viewing angles, higher refresh rates, and thinner sizes. Therefore, they are widely adopted by smartphones and continue to be developed toward low power consumption, low cost, and large size.

Currently, in an array substrate of an AMOLED screen display area, a thin film transistor (TFT) and a capacitor (C) are spatially arranged and separated. When a TFT is fabricated by a metal oxide semiconductor, hydrogen atoms in a hydrogenation process need to enter a metal oxide layer, thereby improving conductivity of the metal oxide layer to cause these regions to form conductors. On the other hand, the hydrogen atoms cannot enter a channel region, so that the region still retains semiconductor characteristics. To achieve this, different metal materials need to be used in a metal gate layer, which is a method that is widely used.

However, on one hand, use of different metal materials in the metal gate layer increases material requirements. On the other hand, a processing difficulty and a processing cost are increased due to the need to process a plurality of materials.

SUMMARY OF THE INVENTION

An embodiment of the present disclosure provides an array and a method of fabricating the same, a display panel, and a display device are provided, which simplifies a process and reduces production costs by doping a gate insulating layer above a channel region with fluorine atoms and only needing to use a metal as a metal gate layer.

In a first aspect, the present application provides a method of fabricating an array substrate, comprising steps of:
depositing to form a buffer layer, a metal oxide layer, and a gate insulating layer on the substrate in sequence, wherein the metal oxide layer comprises a first region and a second region, and the second region comprises a channel region;
fluorine-atom-doping the gate insulating layer such that the gate insulating layer above the channel region comprises fluorine atoms, and other regions of the gate insulating layer do not comprise the fluorine atoms;
forming a metal gate layer and an interlayer dielectric layer on the gate insulating layer in sequence;
performing a hydrogenation activation process, such that the metal oxide layer of the channel region maintains semiconductor characteristics due to diffusion of hydrogen atoms being blocked by the fluorine atoms comprised in the gate insulating layer above the channel region wherein the hydrogen atoms pass through other regions of the metal oxide layer except for the channel region to form a conductor; and
forming a source/drain wiring layer, an organic planarization layer, an anode wiring layer, and a pixel defining layer on the metal oxide layer in sequence;
wherein the step of forming the buffer layer, the metal oxide layer, and the gate insulating layer on the substrate in sequence includes steps of:
depositing the buffer layer and the metal oxide layer on the substrate in sequence, and further etching the metal oxide layer to form a patterned metal oxide layer; and
depositing to form the gate insulating layer on the metal oxide layer; and
wherein the step of fluorine-atom-doping the gate insulating layer such that the gate insulating layer above the channel region comprises fluorine atoms and other regions of the gate insulating layer do not comprise the fluorine atoms, further comprises steps of:
coating the gate insulating layer with a photoresist, and exposing and developing the photoresist to form a patterned photoresist layer;
fluorine-atom-doping the gate insulating layer with a fluorine-containing plasma such that the gate insulating layer above the channel region comprises the fluorine atoms, and other regions of the gate insulating layer do not comprise the fluorine atoms; and
removing the photoresist layer by ashing and stripping cleaning.

Further, the step of fluorine-atom-doping the gate insulating layer with the fluorine-containing plasma such that the gate insulating layer above the channel region comprises the fluorine atoms, and other regions of the gate insulating layer do not comprise the fluorine atoms, further comprises a step of:
fluorine-atom-doping the gate insulating layer with the fluorine-containing plasma such that the gate insulating layer above the channel region comprises the fluorine atoms to form an inorganic layer, and other regions of the gate insulating layer do not comprise the fluorine atoms.

Further, the step of forming the source/drain wiring layer, the organic planarization layer, the anode wiring layer, and the pixel defining layer on the metal oxide layer in sequence comprises steps of:
etching to form ILD vias in the metal oxide layer, and depositing and etching to form a patterned source/drain wiring layer; and
forming the organic planarization layer, the anode wiring layer, and the pixel defining layer on the source/drain wiring layer in sequence.

Further, the step of forming the organic planarization layer, the anode wiring layer, and the pixel defining layer on the source/drain wiring layer in sequence comprises steps of:
coating, exposing, developing, and solidifying to form a patterned organic planarization layer on the source/drain wiring layer;

depositing and etching to form a patterned anode wiring layer on the organic planarization layer; and coating, exposing, developing, and solidifying to form a patterned pixel defining layer on the anode wiring layer.

Further, the interlayer dielectric layer includes two layers of $SiN_x$ and $SiO_2$.

Further, material of the metal gate layer is at least one of molybdenum, aluminum, indium tin oxide, and indium zinc oxide.

In a second aspect, the present application provides a method of fabricating an array substrate, comprising steps of:

depositing to form a buffer layer, a metal oxide layer, and a gate insulating layer on the substrate in sequence, wherein the metal oxide layer comprises a first region and a second region, and the second region comprises a channel region;

fluorine-atom-doping the gate insulating layer such that the gate insulating layer above the channel region comprises fluorine atoms, and other regions of the gate insulating layer do not comprise the fluorine atoms;

forming a metal gate layer and an interlayer dielectric layer on the gate insulating layer in sequence;

performing a hydrogenation activation process, such that the metal oxide layer of the channel region maintains semiconductor characteristics due to diffusion of hydrogen atoms being blocked by the fluorine atoms comprised in the gate insulating layer above the channel region, wherein the hydrogen atoms pass through other regions of the metal oxide layer except for the channel region, to form a conductor; and forming a source/drain wiring layer, an organic planarization layer, an anode wiring layer, and a pixel defining layer on the metal oxide layer in sequence.

Further, the step of forming the buffer layer, the metal oxide layer, and the gate insulating layer on the substrate in sequence includes steps of:

depositing the buffer layer and the metal oxide layer on the substrate in sequence, and further etching the metal oxide layer to form a patterned metal oxide layer; and depositing to form the gate insulating layer on the metal oxide layer.

Further, the step of fluorine-atom-doping the gate insulating layer such that the gate insulating layer above the channel region comprises fluorine atoms and other regions of the gate insulating layer do not comprise the fluorine atoms, further comprises steps of:

coating the gate insulating layer with a photoresist, and exposing and developing the photoresist to form a patterned photoresist layer;

fluorine-atom-doping the gate insulating layer with a fluorine-containing plasma such that the gate insulating layer above the channel region comprises the fluorine atoms, and other regions of the gate insulating layer do not comprise the fluorine atoms; and removing the photoresist layer by ashing and stripping cleaning.

Further, the step of fluorine-atom-doping the gate insulating layer with the fluorine-containing plasma such that the gate insulating layer above the channel region comprises the fluorine atoms, and other regions of the gate insulating layer do not comprise the fluorine atoms, further comprises a step of:

fluorine-atom-doping the gate insulating layer with the fluorine-containing plasma such that the gate insulating layer above the channel region comprises the fluorine atoms to form an inorganic layer, and other regions of the gate insulating layer do not comprise the fluorine atoms.

Further, the interlayer dielectric layer includes two layers of $SiN_x$ and $SiO_2$.

Further, material of the metal gate layer is at least one of molybdenum, aluminum, indium tin oxide, and indium zinc oxide.

Further, the step of forming the source/drain wiring layer, the organic planarization layer, the anode wiring layer, and the pixel defining layer on the metal oxide layer in sequence comprises steps of:

etching to form ILD vias in the metal oxide layer, and depositing and etching to form a patterned source/drain wiring layer; and forming the organic planarization layer, the anode wiring layer, and the pixel defining layer on the source/drain wiring layer in sequence.

Further, the step of forming the organic planarization layer, the anode wiring layer, and the pixel defining layer on the source/drain wiring layer in sequence comprises steps of:

coating, exposing, developing, and solidifying to form a patterned organic planarization layer on the source/drain wiring layer;

depositing and etching to form a patterned anode wiring layer on the organic planarization layer; and coating, exposing, developing, and solidifying to form a patterned pixel defining layer on the anode wiring layer.

In a third aspect, the application provides an array substrate comprising:

a substrate;

a buffer layer fabricated on a surface of the substrate;

a metal oxide layer fabricated on a surface of the buffer layer, wherein the metal oxide layer comprises a channel region and a conductor region, and the metal oxide layer is etched to provide with interlayer dielectric (ILD) vias;

a gate insulating layer fabricated on the metal oxide layer, wherein the gate insulating layer comprises a non-fluorine atom doped region and a fluorine atom doped region, and the fluorine atom doped region is located above the channel region;

a metal gate layer fabricated on the gate insulating layer;

an interlayer dielectric layer fabricated on the metal gate layer;

a source/drain wiring layer formed in the ILD vias; and an organic planarization layer, an anode wiring layer and a pixel defining layer fabricated on the interlayer dielectric layer.

Further, the metal gate layer includes a first metal gate region and a second metal gate region, and the first metal gate region is fabricated on the fluorine atom doped region, and the second metal gate region is fabricated on the non-fluorine atom doped region.

Further, the conductor region includes a first conductor region, a second conductor region, and a third conductor region, wherein the first conductor region and the second conductor region are located on two sides of the channel region and below the source/drain wiring layer, and the third conductor region is located below the second metal gate region.

Further, the interlayer dielectric layer includes two layers of $SiN_x$ and $SiO_2$.

Further, material of the metal gate layer is at least one of molybdenum, aluminum, indium tin oxide, and indium zinc oxide.

In a fourth aspect, the present application provides a display panel comprising an array substrate according to anyone in the second aspect.

In a fourth aspect, the present application provides a display device comprising a display panel according to anyone in the third aspect.

In an embodiment of the present disclosure, a gate insulating layer above a channel region is doped with fluorine atoms. Since a fluorine-containing inorganic layer can absorb hydrogen atoms, it can block hydrogen atoms from diffusing downward into a metal oxide semiconductor, thereby avoiding affecting electrical properties of thin film transistors. In another aspect, a metal oxide semiconductor as a lower electrode of a capacitor can still receive the hydrogen atoms to become a conductor, and the conductor together with the metal gate layer form a capacitance. A process is simplified and production costs are reduced by doping a gate insulating layer above a channel region with fluorine atoms and only needing to use a metal as a metal gate layer.

BRIEF DESCRIPTION OF THE SEVERAL VIEWS OF THE DRAWINGS

In order to more clearly describe technical solutions in embodiments of the present disclosure, drawings required to be used for the embodiments or descriptions are simply described hereinafter. Apparently, the drawings described below only illustrate some embodiments of the present disclosure. Those skilled in the art can obtain other drawings based on these drawings disclosed herein without creative effort.

FIG. 1 is a cross-sectional diagram of a conventional array substrate.

FIG. 2 is an embodied flowchart of a method of fabricating an array substrate according to an embodiment of the present disclosure.

DESCRIPTION OF SPECIFIC EMBODIMENTS OF THE INVENTION

Figure 3:
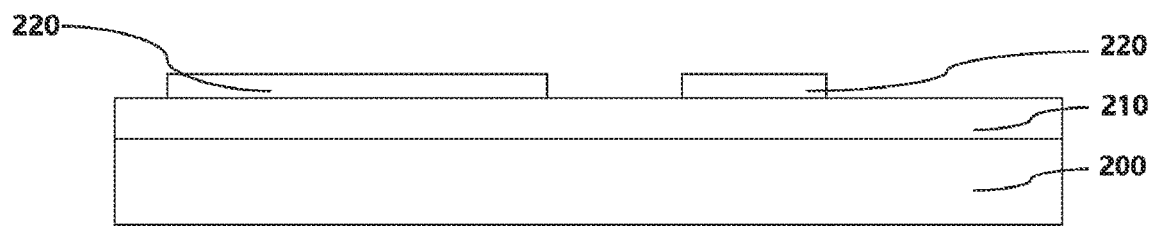
FIG. 3 is a structural schematic diagram after depositing a buffer layer and a metal oxide layer in sequence in the method of fabricating the array substrate according to an embodiment of the present disclosure.

The technical solutions in the embodiments of the present application are clearly and completely described in the following with reference to the drawings in the embodiments of the present application. It is obvious that the described embodiments are only a part of the embodiments of the present application, and not all of the embodiments. All other embodiments obtained by one skilled in the art based on the embodiments of the present application without creative efforts are within the scope of the present application.

In the description of the present disclosure, it is to be understood that orientation or positional relationships of the terms of "center", "longitudinal", "transverse", "length", "width", "thickness", "upper", "lower", "front", "back", "left", "right", "vertical", "horizontal", "top", "bottom", "inside", "outside", etc. are based on orientation or positional relationships shown by the figures. It is merely for the convenience of describing the present disclosure and simplifying the description, but not indicating or implying, to which a device or a component is referred, must have a specific orientation, or must be constructed and operated in a specific orientation. Therefore, it should not be construed as limiting the disclosure. Moreover, the terms "first" and "second" are merely used for descriptive purposes and are not to be construed as indicating or implying a relative importance, or as implicitly indicating the number of the indicated technical features. Thus, features defining "first" or "second" may include one or more of the described features either explicitly or implicitly. In the description of the present disclosure, the meaning of "a plurality" is two or more unless otherwise specifically defined.

As shown in FIG. 1, which is a cross-sectional diagram of a conventional array substrate, a thin film transistor (TFT), and a capacitor (C) spatially arranged and separated. When a TFT is fabricated by a metal oxide semiconductor, hydrogen atoms in a hydrogenation activation process need to enter a metal oxide layer (including three regions 120b, 120c, and 120d), thereby improving conductivity of the metal oxide layer to cause these regions to form conductors. On the other hand, the hydrogen atoms cannot enter a channel region, so that the region still retains semiconductor characteristics. To achieve this, different metal materials need to be used in a metal gate layer. As shown in FIG. 1, a region 140a in a gate insulating layer is made of a metal which hydrogen atoms cannot pass through, such as titanium (Ti), titanium molybdenum alloy, or alumina ($Al_2O_3$). A region 140b of the gate insulating layer is made of a metal which the hydrogen atoms cannot pass through, such as molybdenum (Mo), aluminum (Al), indium tin oxide (ITO), or indium zinc oxide (IZO). On one hand, use of different metal materials in the metal gate layer increases the material requirements. On the other hand, a process complexity is increased, and a processing difficulty and a processing cost are increased, due to the need to process a plurality of materials.

Based on above, an embodiment of the present disclosure provides an array and a method of fabricating the same, a display panel, and a display device are provided.

First, an embodiment of the present disclosure provides a method of fabricating an array substrate, comprising steps of: depositing to form a buffer layer, a metal oxide layer, and a gate insulating layer on the substrate in sequence, wherein the metal oxide layer comprises a first region and a second region, and the second region comprises a channel region; fluorine-atom-doping the gate insulating layer such that the gate insulating layer above the channel region comprises fluorine atoms, and other regions of the gate insulating layer do not comprise the fluorine atoms; forming a metal gate layer and an interlayer dielectric layer on the gate insulating layer in sequence; performing a hydrogenation activation process, such that the metal oxide layer of the channel region maintains semiconductor characteristics due to diffusion of hydrogen atoms being blocked by the fluorine atoms comprised in the gate insulating layer above the channel region, wherein the hydrogen atoms pass through other regions of the metal oxide layer except for the channel region to form a conductor; and forming a source/drain wiring layer, an organic planarization layer, an anode wiring layer, and a pixel defining layer on the metal oxide layer in sequence.

As shown in FIG. 2, FIG. 2 is an embodied schematic diagram of a method of fabricating an array substrate according to an embodiment of the present disclosure. The method comprises steps as follows:

In step 101, a buffer layer, a metal oxide layer, and a gate insulating layer are deposited to form on the substrate in sequence.

The metal oxide layer comprises a first region and a second region, and the second region comprises a channel region. The first region and the second region are used to form a TFT and a capacitor, respectively. In an embodiment of the present disclosure, the substrate can be a glass substrate. Specifically, the glass substrate can be a glass that has been cleaned in advance, for example, to remove residual particles, metals, organic substances, and the like.

The gate insulating layer refers to the GI layer, and the GI layer is formed by a process called GI deposition in a low temperature poly-silicon (LTPS) process, i.e., the GI layer is formed by deposition. The GI layer is generally an insulating layer between the metal gate layer and the semiconductor layer in the TFT, usually $SiN_x/SiO_x$, and is called a gate insulator, that is, a gate insulating layer.

Further, the step of forming the buffer layer, the metal oxide layer, and the gate insulating layer on the substrate in sequence includes steps of: depositing the buffer layer and the metal oxide layer on the substrate in sequence, and further etching the metal oxide layer to form a patterned metal oxide layer; and depositing to form the gate insulating layer on the metal oxide layer.

Figure 4:
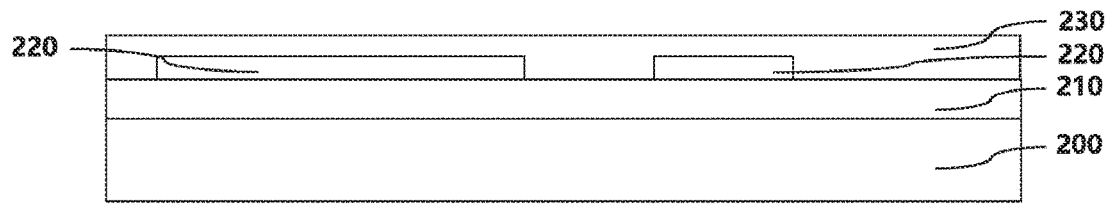
FIG. 4 is a structural schematic diagram after depositing a gate insulating layer on the metal oxide layer in the method of fabricating the array substrate according to an embodiment of the present disclosure.

As shown in FIG. 3, the buffer layer 210 and the metal oxide layer are deposited on the substrate 200 in sequence, and further the metal oxide layer is etched to form a patterned metal oxide layer 220. The metal oxide layer 220 comprises two metal oxide regions, i.e., the first region and the second region, which are respectively used to constitute the thin film transistor (TFT) and the capacitance (C). As shown in FIG. 4, a gate insulating layer 230 is deposited on the metal oxide layer 220.

In step 102, the gate insulating layer is fluorine-atom-doped such that the gate insulating layer above the channel region comprises fluorine atoms, and other regions of the gate insulating layer do not comprise the fluorine atoms.

In an embodiment of the present disclosure, the step of fluorine-atom-doping the gate insulating layer such that the gate insulating layer above the channel region comprises fluorine atoms and other regions of the gate insulating layer do not comprise the fluorine atoms, can further comprise steps of: coating the gate insulating layer with a photoresist, and exposing and developing the photoresist to form a patterned photoresist layer; fluorine-atom-doping the gate insulating layer with a fluorine-containing plasma such that the gate insulating layer above the channel region comprises the fluorine atoms, and other regions of the gate insulating layer do not comprise the fluorine atoms; and removing the photoresist layer by ashing and stripping cleaning.

The photoresist, also known as a photoresist agent, is a photosensitive material used in many industrial processes. Like lithography, a patterned coating layer can be engraved on a surface of a material. There are two kinds of photoresists, a positive photoresist and a negative photoresist. The positive photoresist is a kind of photoresist, and a portion exposing to light is dissolved in a photoresist developer. A portion without exposing to light is not dissolved in the photoresist developer. The negative photoresist is another type of photoresist, and a portion exposing to light is not dissolved in the photoresist developer, and a portion without exposing to light is dissolved in the photoresist developing solution. An embodiment of the present disclosure can form a patterned photoresist layer by the positive photoresist.

The step of fluorine-atom-doping the gate insulating layer with the fluorine-containing plasma such that the gate insulating layer above the channel region comprises the fluorine atoms, and other regions of the gate insulating layer do not comprise the fluorine atoms, further comprises a step of: fluorine-atom-doping the gate insulating layer with the fluorine-containing plasma such that the gate insulating layer above the channel region comprises the fluorine atoms to form an inorganic layer, and other regions of the gate insulating layer do not comprise the fluorine atoms. Further, the inorganic layer can include SiNF and SiOF.

Figure 5:
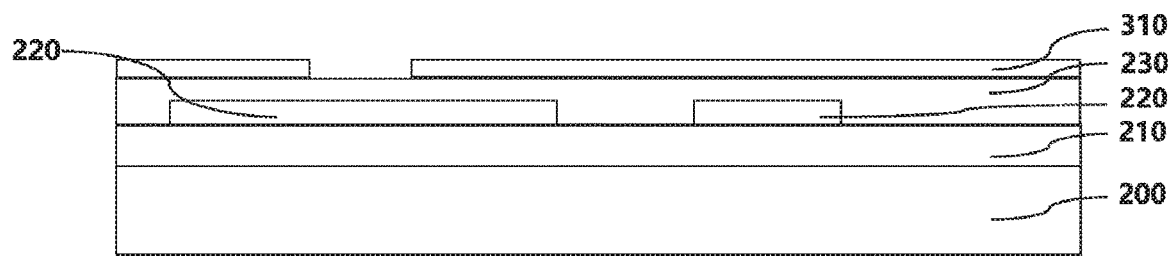
FIG. 5 is a structural schematic diagram after coating, exposing, and developing on the gate insulating layer to form a patterned photoresist layer in the method of fabricating the array substrate according to an embodiment of the present disclosure.
Figure 6:
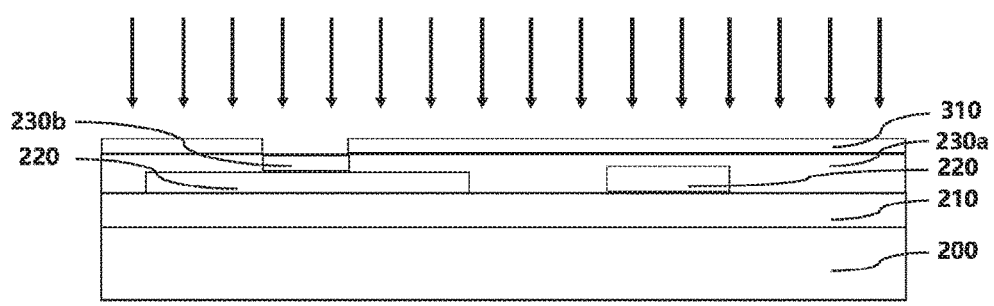
FIG. 6 is a structural schematic diagram after fluorine-atom-doping the gate insulating layer with a fluorine-containing plasma such that the gate insulating layer above the channel region comprises fluorine atoms, and other regions of the gate insulating layer do not comprise the fluorine atoms, in the method of fabricating the array substrate according to an embodiment of the present disclosure.
Figure 7:
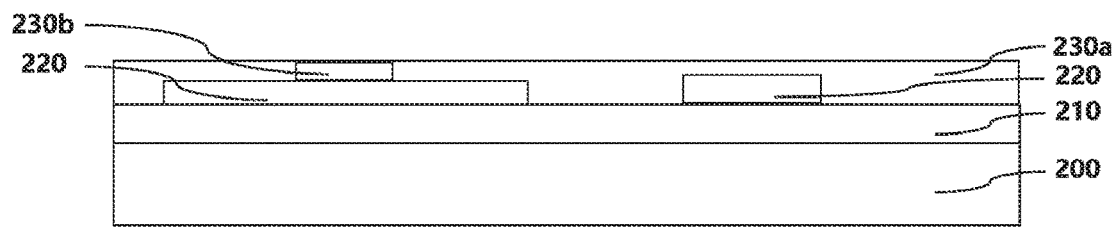
FIG. 7 is a structural schematic diagram after removing the photoresist layer by ashing and stripping cleaning in the method of fabricating the array substrate according to an embodiment of the present disclosure.

Specifically, as shown in FIG. 5, the gate insulating layer is coated with a patterned photoresist (PR) layer 310 by exposing and developing. As shown in FIG. 6 together with FIG. 10, the gate insulating layer is fluorine-atom-doped with a fluorine-containing plasma, such that the gate insulating layer 230b above the channel region 220d comprises the fluorine atoms, and other regions of the gate insulating layer 230a does not comprise the fluorine atoms. As shown in FIG. 7, the photoresist layer 310 is removed by ashing and stripping cleaning.

In step 103, a metal gate layer and an interlayer dielectric layer are formed on the gate insulating layer in sequence.

The step of forming the metal gate layer and the interlayer dielectric layer on the gate insulating layer in sequence comprises steps of: depositing and etching to form a patterned metal gate layer on the gate insulating layer in sequence, and depositing an interlayer dielectric (ILD) layer. ILD refers to an intermediate insulation layer, which also refers to an interlayer dielectric layer. The interlayer dielectric layer mainly provides electrical insulation among conductor regions and metals inside devices, and provides isolation protection from a surrounding environment. In an embodiment of the present disclosure, the interlayer dielectric (ILD) layer includes two layers of $SiN_x$ and $SiO_2$, and material of the metal gate layer can be at least one of molybdenum (Mo), aluminum (Al), indium tin oxide (ITO), or indium zinc oxide (IZO).

Figure 8:
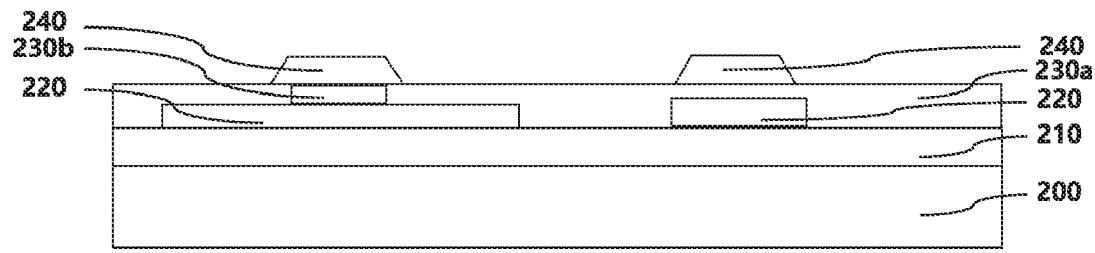
FIG. 8 is a structural schematic diagram after depositing and etching to form a patterned metal gate layer on the gate insulating layer in the method of fabricating the array substrate according to an embodiment of the present disclosure.
Figure 9:
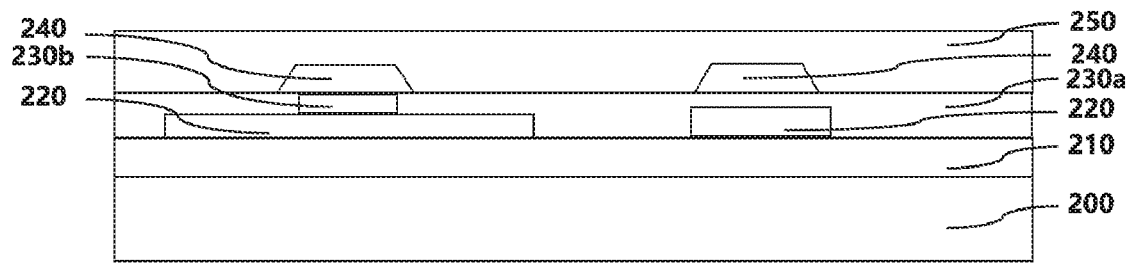
FIG. 9 is a structural schematic diagram after depositing an interlayer dielectric layer on the metal gate layer in the method of fabricating the array substrate according to an embodiment of the present disclosure.

Specifically, as shown in FIG. 8, the patterned metal gate layer 240 is formed on the gate insulating layer by depositing and etching. As shown in FIG. 9, the interlayer dielectric (ILD) layer 250 is deposited on the metal gate layer 240. The interlayer dielectric (ILD) layer 250 comprises two layers of $SiN_x$ and $SiO_2$.

In step 104, a hydrogenation activation process is performed, such that the metal oxide layer of the channel region maintains semiconductor characteristics due to diffusion of hydrogen atoms being blocked by the fluorine atoms comprised in the gate insulating layer above the channel region, such that wherein the hydrogen atoms pass through other regions of the metal oxide layer except for the channel region to form a conductor.

Figure 10:
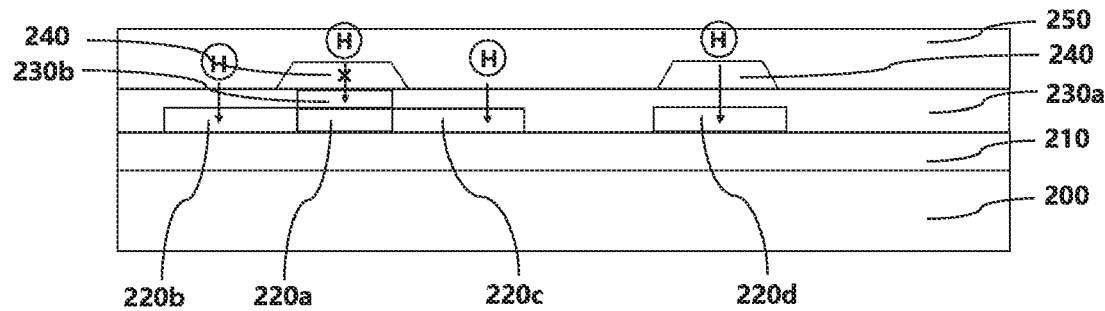
FIG. 10 is a structural schematic diagram after performing a hydrogenation activation process in the method of fabricating the array substrate according to an embodiment of the present disclosure.

Specifically, as shown in FIG. 10, in the hydrogenation activation process, hydrogen atoms in the gate insulating layer (such as a $SiN_x$ layer) pass through regions of the metal gate layer 240 and the gate insulating layer without containing fluorine atoms, so as to enter regions 220b, 220c, and 220d of the metal oxide layer, such that the metal oxide of these regions form conductors. A region 230b of the gate insulating layer above the channel region 220a of the metal oxide layer can block diffusion of hydrogen atoms due to the fluorine atom, so that the metal oxide in the region 220a still maintains the characteristics of the semiconductor.

In addition, in an embodiment of the present disclosure, in the hydrogenation activation process, a plasma hydrogenation method or a solid state diffusion method can be used.

In step 105, a source/drain wiring layer, an organic planarization layer, an anode wiring layer, and a pixel defining layer are formed on the metal oxide layer in sequence.

The step of forming the organic planarization layer, the anode wiring layer, and the pixel defining layer on the source/drain wiring layer in sequence comprises steps of: coating, exposing, developing, and solidifying to form a patterned organic planarization layer on the source/drain wiring layer; depositing and etching to form a patterned anode wiring layer on the organic planarization layer; and coating, exposing, developing, and solidifying to form a patterned pixel defining layer on the anode wiring layer.

Figure 11:
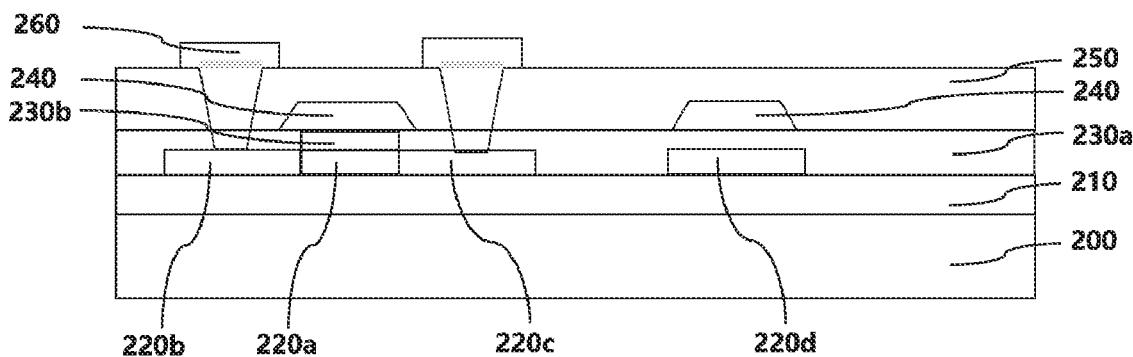
FIG. 11 is a structural schematic diagram after etching to form interlayer dielectric (ILD) vias in regions 220b and 220c in the metal oxide layer, and depositing and etching to form a patterned source/drain wiring layer in the method of fabricating the array substrate according to an embodiment of the present disclosure.
Figure 12:
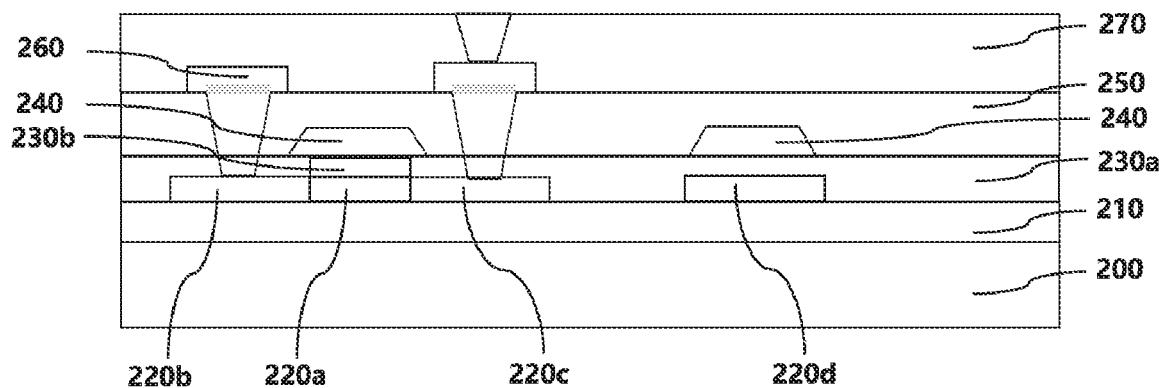
FIG. 12 is a structural schematic diagram after coating, exposing, developing, and solidifying to form a patterned organic planarization layer on the source/drain wiring layer in the method of fabricating the array substrate according to an embodiment of the present disclosure.
Figure 13:
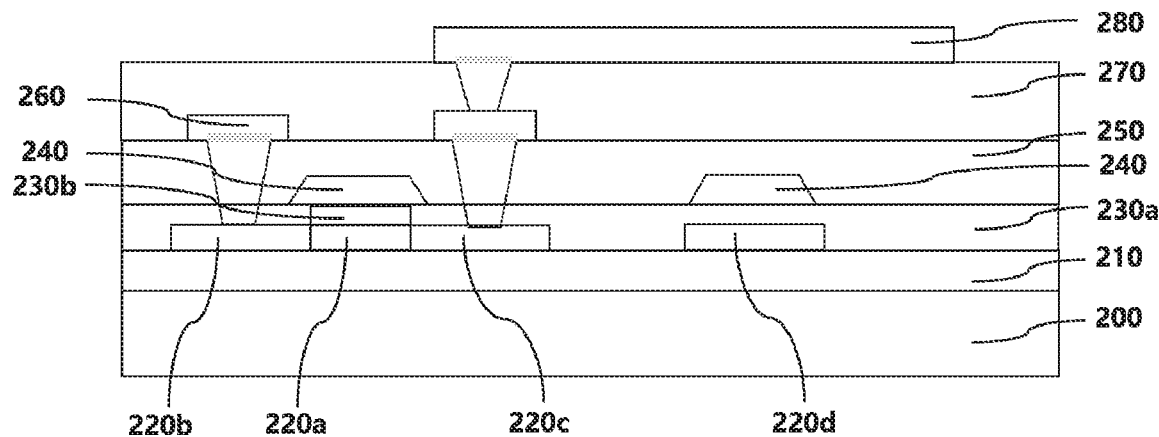
FIG. 13 is a structural schematic diagram after depositing and etching to form a patterned anode wiring layer on the organic planarization layer in the method of fabricating the array substrate according to an embodiment of the present disclosure.
Figure 14:
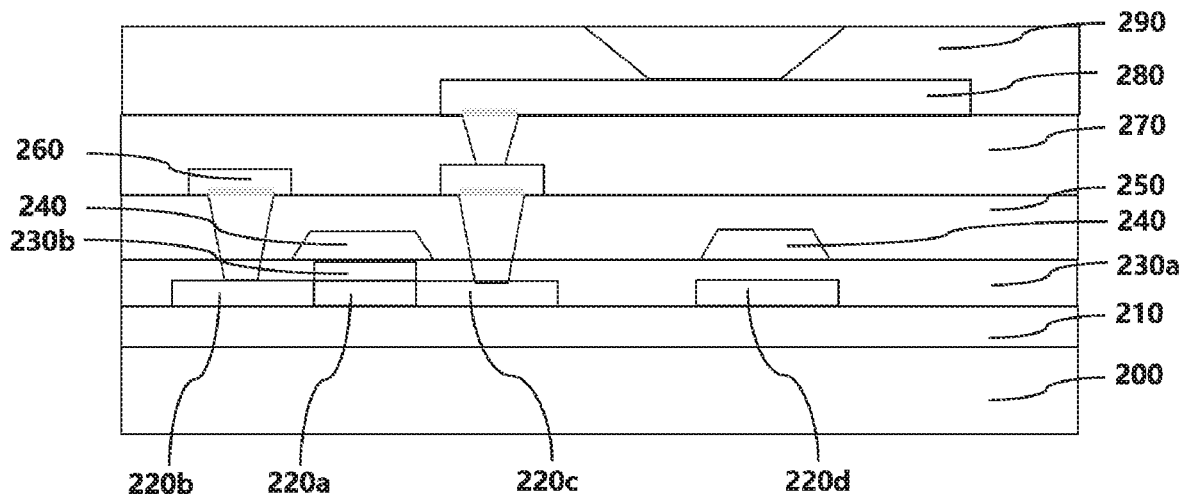
FIG. 14 is an embodied structural schematic diagram of an array substrate according to an embodiment of the present disclosure.

Specifically, as shown in FIG. 11, ILD vias are formed in the regions 220b and 220c of the metal oxide layer by etching, and the patterned source/drain wiring layer 260 is further formed by depositing and etching. As shown in FIG. 12, the patterned organic planarization layer 270 is formed on the source/drain wiring layer by coating, exposing, developing, and solidifying. As shown in FIG. 13, a patterned anode wiring layer 280 is formed on the organic planarization layer 270 by depositing and etching. At last, as shown in FIG. 14, a patterned pixel defining layer 290 is formed on the anode wiring layer by coating, exposing, developing, and solidifying.

In a method of fabricating an array substrate according to an embodiment of the present disclosure, a gate insulating layer above a channel region is doped with fluorine atoms. Since a fluorine-containing inorganic layer can absorb hydrogen atoms, it can the block hydrogen atoms from diffusing downward into a metal oxide semiconductor, thereby avoiding affecting electrical properties of thin film transistors. In another aspect, a metal oxide semiconductor as a lower electrode of a capacitor can still receive the hydrogen atoms to become a conductor, and the conductor together with the metal gate layer form a capacitance. A process is simplified and production costs are reduced by doping the gate insulating layer above the channel region with the fluorine atoms and only needing to use a metal as the metal gate layer.

In order to better implement the method for fabricating the array substrate in an embodiment of the present disclosure, an array substrate is further provided in an embodiment of the present disclosure. The array substrate includes:
  a substrate;
  a buffer layer fabricated on a surface of the substrate;
  a metal oxide layer fabricated on a surface of the buffer layer, wherein the metal oxide layer comprises a channel region and a conductor region, and the metal oxide layer is etched to provide with interlayer dielectric (ILD) vias;
  a gate insulating layer fabricated on the metal oxide layer, wherein the gate insulating layer comprises a non-fluorine atom doped region and a fluorine atom doped region, and the fluorine atom doped region is located above the channel region;
  a metal gate layer fabricated on the gate insulating layer;
  an interlayer dielectric layer fabricated on the metal gate layer,
  a source/drain wiring layer formed in the ILD vias; and
  an organic planarization layer, an anode wiring layer, and a pixel defining layer fabricated on the interlayer dielectric layer.

Further, the metal gate layer includes a first metal gate region and a second metal gate region, and the first metal gate region is fabricated on the fluorine atom doped region, and the second metal gate region is fabricated on the non-fluorine atom doped region.

Further, the conductor region includes a first conductor region, a second conductor region, and a third conductor region, wherein the first conductor region and the second conductor region are located on two sides of the channel region and below the source/drain wiring layer, and the third conductor region is located below the second metal gate region.

Further, the interlayer dielectric layer includes two layers of $SiN_x$ and $SiO_2$.

Further, material of the metal gate layer is at least one of molybdenum, aluminum, indium tin oxide, and indium zinc oxide.

Specifically, as shown in FIG. 14, the array substrate comprises a substrate 200, a buffer layer 210, a metal oxide layer 220, a gate insulating layer, a metal fate layer 240, an interlayer dielectric (ILD) layer 250, a source/drain wiring layer 260, an organic planarization layer 270, an anode wiring layer 280, and a pixel defining layer 290, wherein the metal oxide layer 220 includes a channel region 220a, conductor regions 220b, 220c, and 220d, and the gate insulating layer includes a non-fluorine atom doping region 230a and a fluorine atom doping region 230b. The metal gate layer 240 includes two blocks of metal gate layers 240a and 240b, wherein a block of metal gate layer 240a is located above the channel region 220a, and a block of metal gate layer 240b is located above the capacitor lower electrode 220d.

In an embodiment of the present disclosure, a gate insulating layer above a channel region of the array substrate is doped with fluorine atoms. Since a fluorine-containing inorganic layer can absorb hydrogen atoms, it can block hydrogen atoms from diffusing downward into a metal oxide semiconductor, thereby avoiding affecting electrical properties of thin film transistors. In another aspect, the metal oxide semiconductor as a lower electrode of a capacitor can still receive the hydrogen atoms to become a conductor, and the conductor together with the metal gate layer form a capacitance. A process is simplified and production costs are reduced by doping the gate insulating layer above the channel region with fluorine atoms and only needing to use a metal as the metal gate layer.

On a basis of the array substrate, a display panel is further provided in an embodiment of the present disclosure, and the display panel includes the array substrate as described in an embodiment of the present disclosure. Specifically, the display panel can be an active-matrix organic light-emitting diode (AMOLED) display panel.

On a basis of the display panel, a display device is further provided in an embodiment of the present disclosure, and the display device includes a display panel as described in an embodiment of the present disclosure.

In the above embodiments, descriptions of the various embodiments have their respective focuses. For a part that is not detailed in an embodiment, the detailed description in the other embodiments above can be referred thereto, and details are not described herein again.

In a specific implementation, the foregoing various units or structures can be implemented as a separate entity, or can be implemented in any combination, as the same or several entities. For the specific implementation of the above various units or structures, refer to the foregoing method embodiments, which is not described herein again.

A method of fabricating an array substrate, an array substrate, a display panel, and a display device provided by the embodiments of the present disclosure have been described in detail above, and the principles and embodiments of the present disclosure are described in detail herein. The description of the above embodiments is only for the purpose of understanding the method of the disclosure and its core idea. At the same time, the specific embodiments and application ranges can be changed by those skilled in the art according to the idea of the present disclosure. In conclusion, the content of the specification should not be construed as limiting the disclosure.

What is claimed is:

1. A method of fabricating an array substrate, comprising steps of:
depositing to form a buffer layer, a metal oxide layer, and a gate insulating layer on a substrate in sequence, wherein the metal oxide layer comprises a first region and a second region, and the second region comprises a channel region;
fluorine-atom-doping the gate insulating layer such that the gate insulating layer above the channel region comprises fluorine atoms, and other regions of the gate insulating layer do not comprise the fluorine atoms;
forming a metal gate layer and an interlayer dielectric layer on the gate insulating layer in sequence;
performing a hydrogenation activation process, such that the metal oxide layer of the channel region maintains semiconductor characteristics due to diffusion of hydrogen atoms being blocked by the fluorine atoms comprised in the gate insulating layer above the channel region, wherein the hydrogen atoms pass through other regions of the metal oxide layer except for the channel region to form a conductor; and
forming a source/drain wiring layer, an organic planarization layer, an anode wiring layer, and a pixel defining layer on the metal oxide layer in sequence;
wherein the step of forming the buffer layer, the metal oxide layer, and the gate insulating layer on the substrate in sequence includes steps of:
depositing the buffer layer and the metal oxide layer on the substrate in sequence, and further etching the metal oxide layer to form a patterned metal oxide layer; and
depositing to form the gate insulating layer on the metal oxide layer; and
wherein the step of fluorine-atom-doping the gate insulating layer such that the gate insulating layer above the channel region comprises fluorine atoms and other regions of the gate insulating layer do not comprise the fluorine atoms, further comprises steps of:
coating the gate insulating layer with a photoresist, and exposing and developing the photoresist to form a patterned photoresist layer;
fluorine-atom-doping the gate insulating layer with a fluorine-containing plasma such that the gate insulating layer above the channel region comprises the fluorine atoms, and other regions of the gate insulating layer do not comprise the fluorine atoms; and
removing the photoresist layer by ashing and stripping cleaning.

2. The method of fabricating the array substrate according to claim 1, wherein the step of fluorine-atom-doping the gate insulating layer with the fluorine-containing plasma such that the gate insulating layer above the channel region comprises the fluorine atoms, and other regions of the gate insulating layer do not comprise the fluorine atoms, further comprises a step of:
fluorine-atom-doping the gate insulating layer with the fluorine-containing plasma such that the gate insulating layer above the channel region comprises the fluorine atoms to form an inorganic layer, and other regions of the gate insulating layer do not comprise the fluorine atoms.

3. The method of fabricating the array substrate according to claim 1, wherein the step of forming the source/drain wiring layer, the organic planarization layer, the anode wiring layer, and the pixel defining layer on the metal oxide layer in sequence comprises steps of:
etching to form interlayer dielectric (ILD) vias in the metal oxide layer, and depositing and etching to form a patterned source/drain wiring layer; and
forming the organic planarization layer, the anode wiring layer, and the pixel defining layer on the source/drain wiring layer in sequence.

4. The method of fabricating the array substrate according to claim 3, wherein the step of forming the organic planarization layer, the anode wiring layer, and the pixel defining layer on the source/drain wiring layer in sequence comprises steps of:
coating, exposing, developing, and solidifying to form a patterned organic planarization layer on the source/drain wiring layer;

depositing and etching to form a patterned anode wiring layer on the organic planarization layer; and coating, exposing, developing, and solidifying to form a patterned pixel defining layer on the anode wiring layer.

5. The method of fabricating the array substrate according to claim 1, wherein the interlayer dielectric layer includes two layers of $SiN_x$ and $SiO_2$.

6. The method of fabricating the array substrate according to claim 1, wherein a material of the metal gate layer is at least one of molybdenum, aluminum, indium tin oxide, and indium zinc oxide.

7. A method of fabricating an array substrate, comprising steps of:

depositing to form a buffer layer, a metal oxide layer, and a gate insulating layer on a substrate in sequence, wherein the metal oxide layer comprises a first region and a second region, and the second region comprises a channel region;

fluorine-atom-doping the gate insulating layer such that the gate insulating layer above the channel region comprises fluorine atoms, and other regions of the gate insulating layer do not comprise the fluorine atoms;

forming a metal gate layer and an interlayer dielectric layer on the gate insulating layer in sequence;

performing a hydrogenation activation process, such that the metal oxide layer of the channel region maintains semiconductor characteristics due to diffusion of hydrogen atoms being blocked by the fluorine atoms comprised in the gate insulating layer above the channel region, wherein the hydrogen atoms pass through other regions of the metal oxide layer except for the channel region to form a conductor; and forming a source/drain wiring layer, an organic planarization layer, an anode wiring layer, and a pixel defining layer on the metal oxide layer in sequence.

8. The method of fabricating the array substrate according to claim 7, wherein the step of forming the buffer layer, the metal oxide layer, and the gate insulating layer on the substrate in sequence includes steps of:

depositing the buffer layer and the metal oxide layer on the substrate in sequence, and further etching the metal oxide layer to form a patterned metal oxide layer; and depositing to form the gate insulating layer on the metal oxide layer.

9. The method of fabricating the array substrate according to claim 7, wherein the step of fluorine-atom-doping the gate insulating layer such that the gate insulating layer above the channel region comprises fluorine atoms and other regions of the gate insulating layer do not comprise the fluorine atoms, further comprises steps of:

coating the gate insulating layer with a photoresist, and exposing and developing the photoresist to form a patterned photoresist layer;

fluorine-atom-doping the gate insulating layer with a fluorine-containing plasma such that the gate insulating layer above the channel region comprises the fluorine atoms, and other regions of the gate insulating layer do not comprise the fluorine atoms; and removing the photoresist layer by ashing and stripping cleaning.

10. The method of fabricating the array substrate according to claim 9, wherein the step of fluorine-atom-doping the gate insulating layer with the fluorine-containing plasma such that the gate insulating layer above the channel region comprises the fluorine atoms, and other regions of the gate insulating layer do not comprise the fluorine atoms, further comprises a step of:

fluorine-atom-doping the gate insulating layer with the fluorine-containing plasma such that the gate insulating layer above the channel region comprises the fluorine atoms to form an inorganic layer, and other regions of the gate insulating layer do not comprise the fluorine atoms.

11. The method of fabricating the array substrate according to claim 7, wherein the step of forming the source/drain wiring layer, the organic planarization layer, the anode wiring layer, and the pixel defining layer on the metal oxide layer in sequence comprises steps of:

etching to form ILD vias in the metal oxide layer, and depositing and etching to form a patterned source/drain wiring layer; and forming the organic planarization layer, the anode wiring layer, and the pixel defining layer on the source/drain wiring layer in sequence.

12. The method of fabricating the array substrate according to claim 11, wherein the step of forming the organic planarization layer, the anode wiring layer, and the pixel defining layer on the source/drain wiring layer in sequence comprises steps of:

coating, exposing, developing, and solidifying to form a patterned organic planarization layer on the source/drain wiring layer;

depositing and etching to form a patterned anode wiring layer on the organic planarization layer; and coating, exposing, developing, and solidifying to form a patterned pixel defining layer on the anode wiring layer.

13. The method of fabricating the array substrate according to claim 7, wherein the interlayer dielectric layer includes two layers of $SiN_x$ and $SiO_2$.

14. The method of fabricating the array substrate according to claim 7, wherein a material of the metal gate layer is at least one of molybdenum, aluminum, indium tin oxide, and indium zinc oxide.

* * * * *